United States Patent
Chang et al.

(10) Patent No.: US 6,768,162 B1
(45) Date of Patent: Jul. 27, 2004

(54) SPLIT GATE FLASH MEMORY CELL AND MANUFACTURING METHOD THEREOF

(75) Inventors: Ko-Hsing Chang, Hsinchu (TW); Hann-Jye Hsu, Taichung Hsien (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/604,612

(22) Filed: Aug. 5, 2003

(51) Int. Cl.$^7$ ............................................ H01L 29/788
(52) U.S. Cl. .................................... 257/316; 438/266
(58) Field of Search ................................. 436/257–267; 257/316–323

(56) References Cited

U.S. PATENT DOCUMENTS

2002/0070405 A1 * 6/2002 Sugiyama et al. .......... 257/314
2003/0042533 A1 * 3/2003 Noro et al. ................. 257/316
2003/0173616 A1 * 9/2003 Kusumi et al. ............. 257/316
2004/0018687 A1 * 1/2004 Hsieh et al. ................ 438/266

* cited by examiner

Primary Examiner—Richard A. Booth
(74) Attorney, Agent, or Firm—Jianq Chyun IP Office

(57) ABSTRACT

A split gate flash memory cell includes a substrate having a trench, a stack structure disposed on the substrate, wherein the stack structure includes a tunneling dielectric layer, a floating gate and a cap layer; a first inter-gate dielectric layer and a second inter-gate dielectric layer disposed on the sidewalls of the stack structure, wherein the first inter-gate dielectric layer is contiguous to the top of the trench; a selective gate disposed on the sidwalls of the first inter-gate dielectric layer and the trench; a selective gate dielectric layer disposed between the selective gate and the substrate; a source region configured in the substrate beside the side of the stack structure with the second inter-gate dielectric layer; and a drain region configured at the bottom of the trench beside one side of the selective gate.

6 Claims, 5 Drawing Sheets

SPLIT GATE FLASH MEMORY CELL AND MANUFACTURING METHOD THEREOF

BACKGROUND OF INVENTION

1. Field of the Invention

The present invention relates to a semiconductor device. More particularly, the present invention relates to a split gate flash memory cell and a manufacturing method thereof.

2. Description of Related Art

A flash memory device provides the property of multiple entries, retrievals and erasures of data. Moreover, the stored information is retained even electrical power is interrupted. As a result, a non-volatile memory device is widely used in personal computers and electronic systems.

A typical flash memory device employs doped polysilicon to fabricate the floating gate and the control gate. Further, a dielectric layer is used to isolate the floating gate from the control gate, whereas the floating gate and the substrate are isolated from each other by a tunneling oxide layer. When a flash memory device performs the write/erase operation of information, proper biases are applied to the control gate and the source/drain regions to inject electrons into or to discharge electrons from the floating gate. Further, the reading of information from a flash memory device is achieved by applying a working voltage to the control gate. The conductive state of the floating gate influences the opening/closing of the channel, wherein the opening/closing of the channel can be interpreted as the binary value of either "0" or "1".

During the erasure of information of the above flash memory device, the amount of electrons being discharged is difficult to control. Therefore, over-erase is resulted when an excessive amount of the electrons or positive charges are discharged from the floating gate. When the over-erase phenomenon is serious, a channel current flow is induced under the floating gate even no working voltage is applied to the control gate, leading to an erroneous interpretation of the data.

To resolve the over-erase problem, a split gate flash memory device is introduced by the industry. FIG. 1 is a schematic, cross-sectional view of a split gate flash memory according to the prior art. As shown in FIG. 1, the flash memory cell includes, sequentially from the substrate 100, a tunneling dielectric layer 102, a floating gate 104, an inter-gate dielectric layer 106 and a selective gate electrode 108. The selective gate electrode 108 is configured above and at the periphery of the floating gate 104, wherein a portion of the selective gate 108 extends over a part of the substrate 100.

The selective gate electrode 108 and the floating gate 104 are isolated from each other by a selective gate dielectric layer 110. The source region 112 is configured in the substrate 100 at one side of the floating gate 104, while the drain region 114 is disposed in the substrate 100 and is extended from one side of the selective gate electrode 108. Therefore, even when an over-erase phenomenon is serious, in which the channel under the floating gate 104 remains open when no working voltage is applied to the selective gate electrode 108, the channel under the selective gate electrode 108 still remains close to preclude a current flow between the drain region 114 and the source region 112 and to obviate an erroneous interpretation of the data.

A split gate structure, on the other hand, demands a larger split gate region and a larger memory cell dimension. The dimension of a split gate memory cell is thus larger than the dimension of the memory cell with the stack gate structure. Increasing the integration of devices thereby becomes difficult.

The increase of integration of integrated circuits by the miniaturization of device is achieved by reducing the gate length of a memory device. However, as the gate length is being reduced, the underlying channel length is also reduced. During the programming of such a memory cell, abnormal punch through thus easily occurs between the source region and the drain region, adversely affecting the electrical performance of the memory device.

Further, during the fabrication of the above flash memory device, there is a mask alignment problem in forming the selective gate electrode. The channel, which underlies the part of the selective gate electrode that extends over the substrate, can not be accurately defined. In other words, if misalignment occurs during patterning of the selective gate electrode, the channel lengths of two neighboring memory cells that share a common source region are not consistent. Asymmetric programming of the memory cells is thereby resulted, leading to different characteristics of two memory cells.

SUMMARY OF INVENTION

Accordingly, the present invention provides a split gate flash memory cell and a fabrication method thereof, wherein the punch through phenomenon generated at the source region and the drain region during the programming operation can be prevented to increase the effectiveness of a memory cell.

The present invention further provides a split gate flash memory cell and a fabrication method thereof, wherein a self-alignment process is used to form the selective gate electrode to prevent the problem of inconsistent channel lengths between two memory cells, and thereby obviating the problem of asymmetric programming of memory cells to increase the effectiveness of the memory cell.

The present invention also provides a split gate flash memory cell and a fabrication method thereof, wherein the selective gate is formed over a sidewall of floating gate and is extended from the floating gate sidewall to the trench sidewall in the substrate. The dimension of the memory cell can be reduced to increase the integration of the memory device.

The present invention provides a split gate flash memory cell, wherein the split gate flash memory cell is formed with a substrate, a stack structure, a first inter-gate dielectric layer, a second inter-gate dielectric layer, a selective gate electrode, a selective gate electrode dielectric layer, a source region and a drain region. The substrate further includes a trench. The stack structure is disposed on the substrate, and the stack structure includes, sequentially from the substrate, a tunneling dielectric layer, a floating gate and a cap layer. The first inter-gate dielectric layer is disposed on the sidewall at the first side of the stack structure, wherein the first inter-gate dielectric layer is contiguous to the top part of the trench. The second inter-gate dielectric layer is disposed on the sidewall at the second side of the stack structure. The selective gate electrode is configured on the sidewalls of first side of the stack structure and the trench. The source region is configured in the substrate beside the second side of the stack structure, while the drain region is configured at the bottom of the trench beside one side of the selective gate electrode.

The selective gate electrode of the split gate flash memory cell of the present invention is disposed on the sidewalls of the trench and of the first side of the stack structure. The channel region is thereby configured along the sidewall of the trench in the substrate (a vertical channel), wherein the channel length is determined by the depth of the trench. Therefore, even the device dimension (gate length) is reduced, the channel length can be accurately controlled by controlling the trench depth. The problem of a current flow between the source region and the drain region after the programming operation can be prevented. Further, the integration of the device can also increase.

The present invention further provides a fabrication method for a split gate flash memory device, wherein the method provides a substrate having a stack structure already formed thereon. Further, the stack structure includes a tunneling dielectric layer, a floating gate and a cap layer, sequentially from the substrate. After forming a source region in the substrate beside a first side of the stack structure, an inter-gate dielectric layer is formed on the sidewall of the stack structure. Thereafter, a trench is formed in the substrate beside a second side of the stack structure. Subsequent to the formation of a selective gate on the sidewall at the second side of the stack gate and on the sidewall of the trench, a drain region is formed at the bottom of the trench beside one side of the selective gate.

In accordance to the fabrication method for a split gate flash memory cell of the present invention, the selective gate is formed by a self-alignment method and not by a photolithography technique. The process window is increased, and the processing time and cost are scaled down. Moreover, the problems of inconsistent channel lengths between neighboring memory cells and asymmetric programming of memory cells are prevented to increase the reliability of the memory device.

Further, the selective gate is formed on the sidewalls of the stack structure and the trench, the channel region of the selective gate is configured in the substrate along the sidewall of the trench (vertical channel region). Therefore, even the device dimension (gate length) is reduced, the channel length is accurately controlled by controlling the depth of the trench. The problem of a current flow between the source region and the drain region after programming is prevented. Further, the integration of device can also increase.

The present invention further provides a fabrication method for a split gate flash memory device, wherein the method includes forming a tunneling dielectric layer, a first conductive layer and a mask layer sequentially on a substrate. A patterned mask layer is formed to expose a portion of the first conductive layer, and a cap layer is formed on the exposed first conductive layer. Thereafter, the mask layer is removed. Further using the cap layer as a mask, the first conductive layer and the tunneling dielectric layer are etched to form a stack structure. A source region is formed in the substrate beside a first side of the stack structure. An inter-gate dielectric layer is formed on the sidewall of the stack structure. Thereafter, a trench is formed in the substrate beside the second side of the stack structure. A selective gate dielectric layer is formed on the sidewall and at the bottom of the trench, and a second conductive layer is formed over the substrate. A portion of the second conductive layer is removed to form a conductive spacer on the sidewall at the first side of the stack structure, and a selective gate on the sidewall at the trench and the sidewall at the second side of the stack structure. A drain region is then formed at the bottom of the trench at one side of the selective gate.

In accordance to the fabrication method for a split gate flash memory cell of the present invention, after removing a portion of the conductive layer to form a conductive spacer on the sidewall at the first side of the stack structure, and a selective gate on the sidewall at the second side of the stack structure and the sidwall of the trench, and forming the drain region further includes performing an etching step to remove the conductive spacer.

Further, in accordance to the fabrication method for a split gate flash memory cell of the present invention, the selective gate is formed by a self-alignment method and not by a photolithography technique. The process window is thus increased, and the processing time and cost are reduced. Moreover, the problems of inconsistent channel lengths between neighboring memory cells and asymmetrical programming of memory cells are prevented to increase the reliability of the memory device.

Further, the selective gate is formed on the sidewalls of the stack structure and the trench, the channel region of the selected gate is configured in the substrate along the sidewall of the trench (vertical channel region). Therefore, even the device dimension (gate length) is reduced, the channel length is accurately controlled by controlling the depth of the trench. The problem of a current flow between the source region and the drain region after programming is prevented. Further, the integration of device can also increase.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
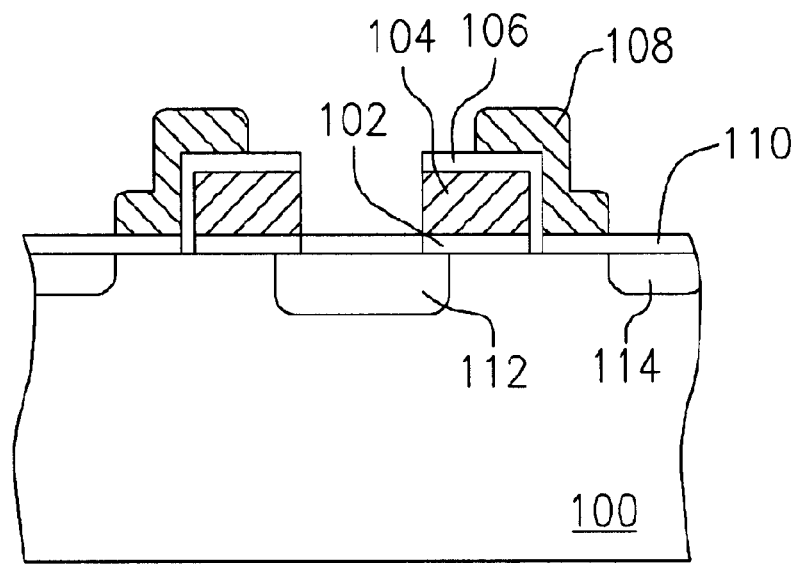
FIG. 1 is a schematic, cross-sectional view illustrating the structure of a split gate flash memory cell according to the prior art.
Figure 2:
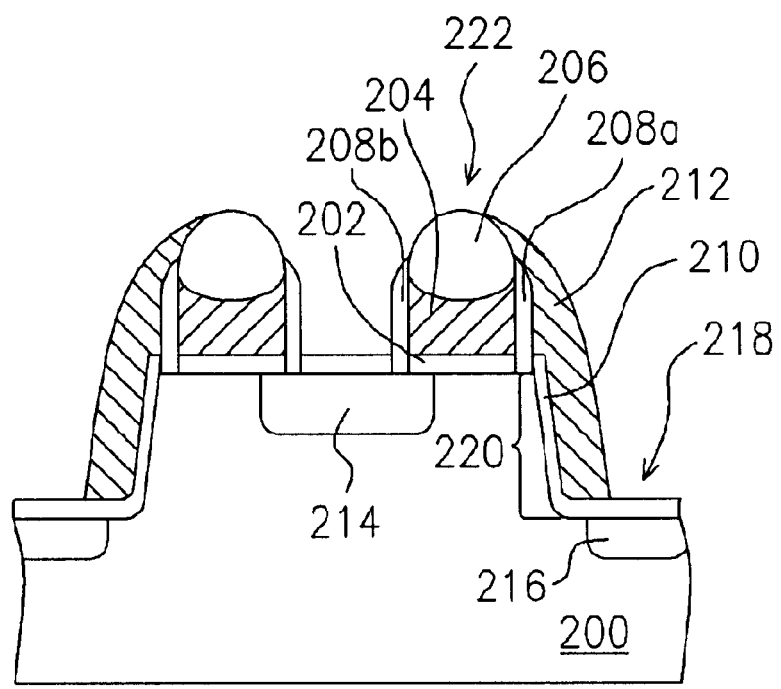
FIG. 2 is a schematic, cross-sectional view illustrating the structure of a split gate flash memory cell according to one exemplary embodiment of the present invention.

FIG. 2 is a schematic, cross-sectional view illustrating the structure of a split gate flash memory cell according to one exemplary embodiment of the present invention.

Referring to FIG. 2, the flash memory cell of the present invention is included with a substrate 200, a tunneling dielectric layer 202, a floating gate 204, a cap layer 206, an inter-gate dielectric layer 208a, an inter-gate dielectric layer 208b, a selective gate dielectric layer 210, a selective gate 212, a source region 214 and a drain region 216.

The substrate 200 includes a trench 218. The floating gate 204 is disposed on the substrate 200. The tunneling dielectric layer 202 is disposed between the floating gate 204 and the substrate 200. The tunneling dielectric layer 202 is formed with, for example, silicon oxide. The cap layer 206 is disposed on the floating gate 204, wherein the cap layer 206 is formed with a material, such as, silicon oxide. The tunneling dielectric layer 202, the floating gate 204 and the cap layer 206 together constitute a stack structure 222. The inter-gate dielectric layer 208a is disposed on a sidewall of the stack structure 222, wherein the inter-gate dielectric layer 208a is contiguous to the top part of the trench 218. The inter-gate dielectric layer 208b is disposed on another sidewall of the stack structure 220. The inter-gate dielectric layer 208a and the inter-gate dielectric layer 208b are formed with a material that includes, for example, silicon oxide/silicon nitride or silicon oxide/silicon nitride/silicon oxide. The selective gate 212 is disposed on the sidewalls of the stack structure 222, the inter-gate dielectric layer 208a and the trench 218. The selective gate 212 is formed with a material that includes, for example, doped polysilicon. The selective inter-gate dielectric layer 210 is disposed between the selective gate 212 and the trench 218. The source region 214 is configured in the substrate 200 beside one side of the inter-gate dielectric layer 208b of the stack structure 222. The drain region 218 is configured at the bottom of the trench 218 beside one side of the selective gate 212.

In accordance with the above embodiment of the present invention, the selective gate 212 is disposed on the sidewalls of the cap layer 206, the inter-gate dielectric layer 208a and the trench 218. The channel region 220 is thereby configured in the substrate along the sidewall of the trench 218 (a vertical channel region). Further, the length of the channel region 220 is determined by the depth of the trench 218. Therefore, even the device dimension (the gate length) is reduced, the channel length can be accurately controlled by controlling the depth of the trench 218. Any unwanted current flow between the source region and the drain region after the programming operation is thus prevented.

Further, since the selective gate 212 is disposed on the sidewalls of the cap layer 208, the inter-gate dielectric layer 208a and the trench 218, the dimension of the memory cell can be reduced to increase the integration of the device.

FIGS. 3A to 3H are schematic, cross-sectional views illustrating the process flow for fabrication a split gate flash memory cell according to one exemplary embodiment of the present invention.

Figure 3A:
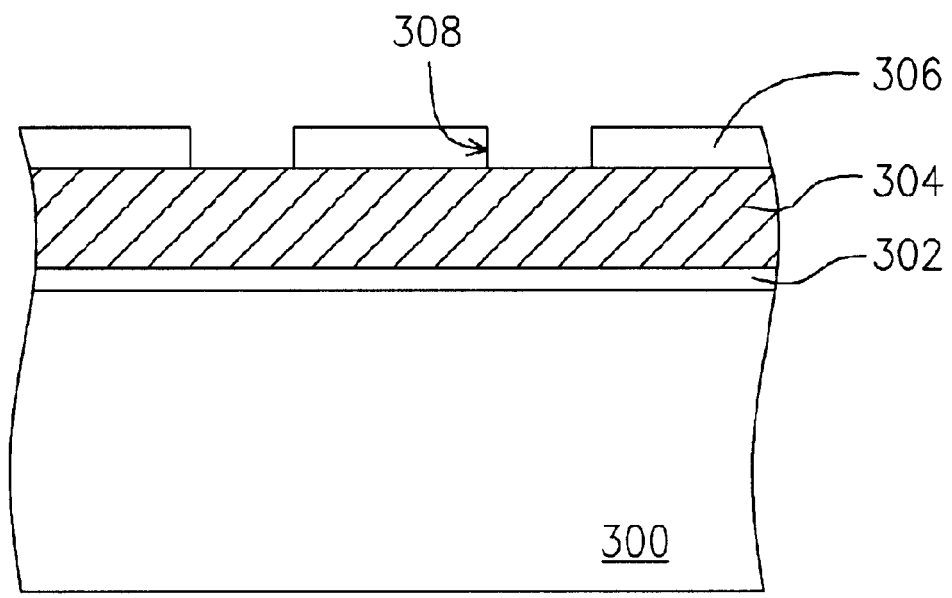
FIGS. 3A to 3H are schematic, cross-sectional views illustrating the process flow for fabrication a split gate flash memory cell according to one exemplary embodiment of the present invention.

Referring to FIG. 3A, a substrate 300 is provided, wherein the substrate 300 is, for example, a silicon substrate, and the substrate 300 is already formed with device isolation structure (not shown in diagram). The device isolation structure is, for example, stripe shape, and is used to define an active region. The device isolation structure is formed by, for example, local oxidation (LOCOS) or shallow trench isolation (STI). A tunneling dielectric layer 302 is then formed on the substrate 300, wherein the tunneling dielectric layer 302 is, for example, silicon oxide. The tunneling dielectric layer 302 is formed by, for example, thermal oxidation.

A conductive layer 304 is then formed on the tunneling dielectric layer 302. The conductive layer 304, for example, a doped polysilicon material, is formed by, for example, forming an undoped polysilicon layer using chemical vapor deposition, followed by conducting an ion implantation process.

A mask layer 306 is further formed on the conductive layer 304, wherein the mask layer 306, formed with a material, such as, silicon nitride, is formed by, for example, chemical vapor deposition. Thereafter, the mask layer 306 is patterned to form a plurality of openings 308 that expose the conductive layer 304.

Figure 3B:
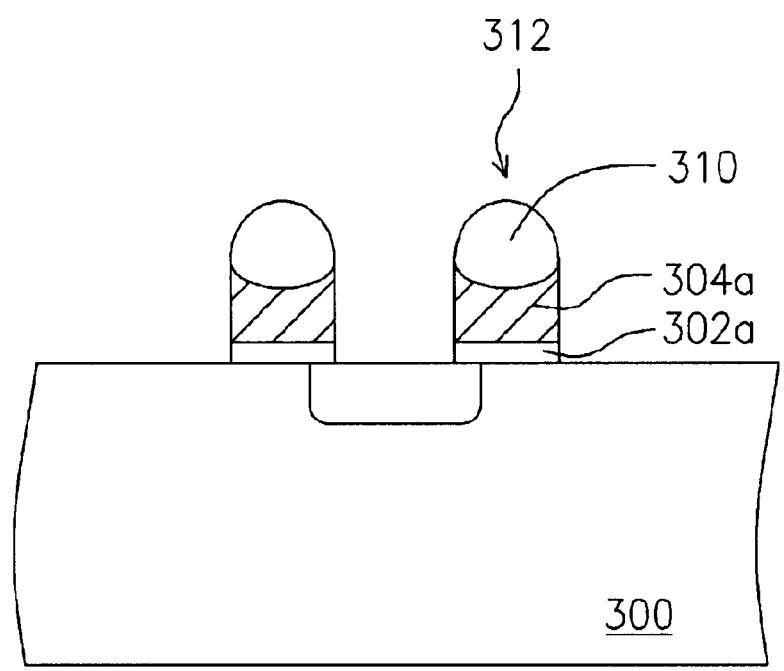

Referring to FIG. 3B, a cap layer 310 is formed on the conductive layer 304 exposed by the opening 308. The cap layer 310, such as, a silicon oxide material, is formed by, for example, thermal oxidation. After the cap layer 310 is formed, the mask layer 306 is removed. Further using the cap layer 310 as a self-alignment mask, the conductive layer 304, the tunneling dielectric layer 302 are etched until the substrate 300 is exposed to form the conductive layer 304a and the tunneling dielectric layer 302a. The cap layer 310, the conductive layer 304a and the tunneling dielectric layer 302a form a stack structure 312, wherein the conductive layer 304a serves as the floating gate of a memory cell.

Figure 3C:
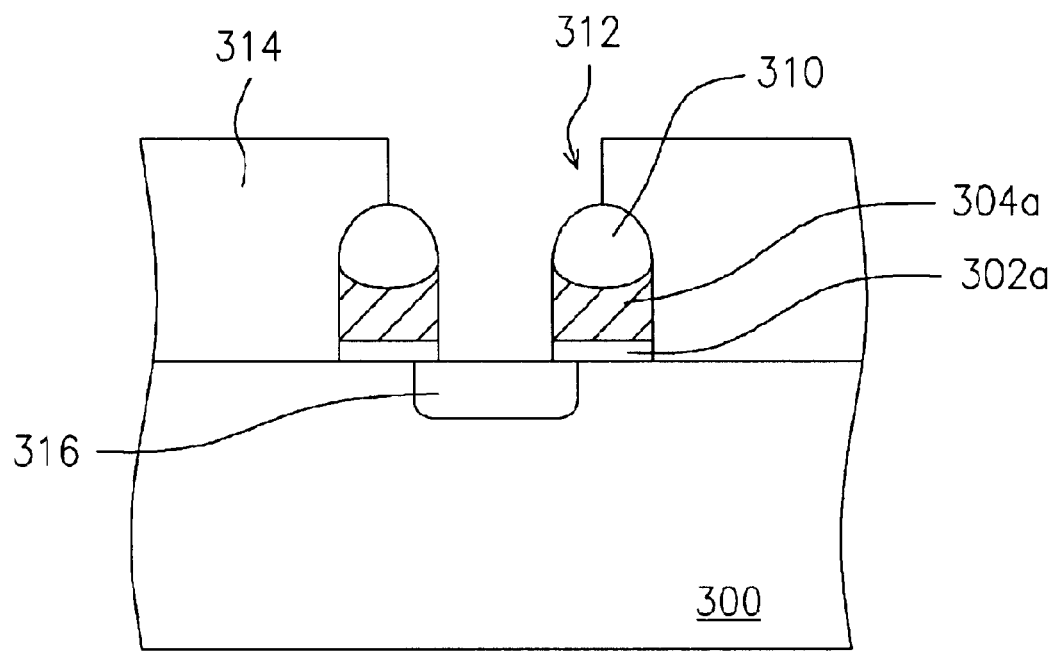

Continuing to FIG. 3C, a patterned photoresist layer 314 is formed on the substrate 300. The patterned photoresist layer 314 exposes a predetermined region for a source region. An ion implantation step is conducted to form the source region 316 in the substrate 300 beside one side of the stack structure 312.

Figure 3D:
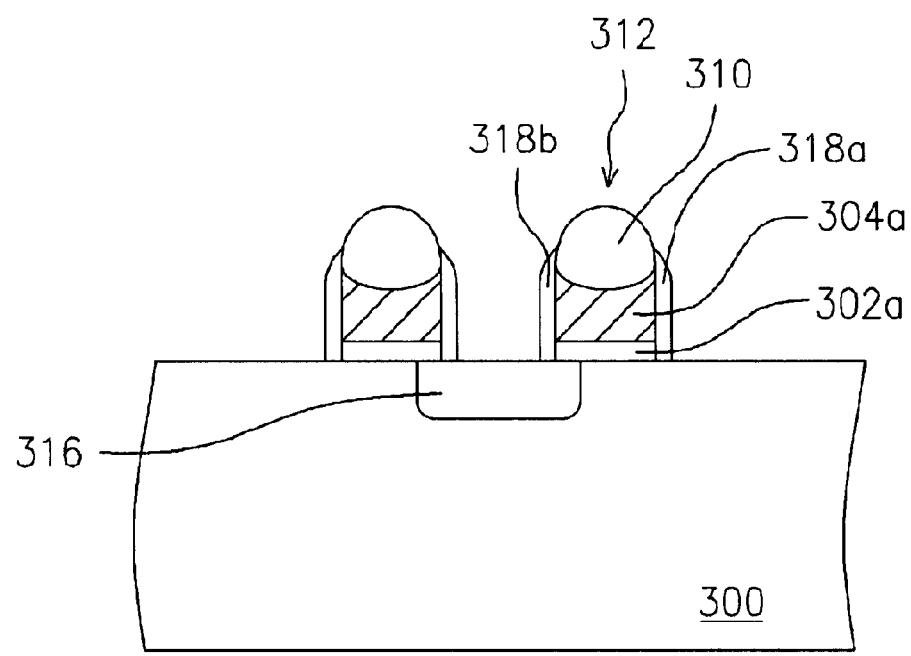

Referring to FIG. 3D, the patterned phototresist layer 314 is removed. An inter-gate dielectric layer 318a and an inter-gate dielectric layer 318b are then formed on the sidwalls of the stack structure 312. The inter-gate dielectric layer 318a and the inter-gate dielectric layer 318b are formed with materials, such as, silicon oxide/silicon nitride, etc. The inter-gate dielectric layer 318a and the inter-gate dielectric layer 318b are formed by, for example, forming a silicon oxide layer by thermal oxidation and forming a silicon nitride layer using low pressure chemical vapor deposition, followed by conducting an anisotropic etching step to remove portions of the silicon oxide layer and the silicon nitride layer.

Figure 3E:
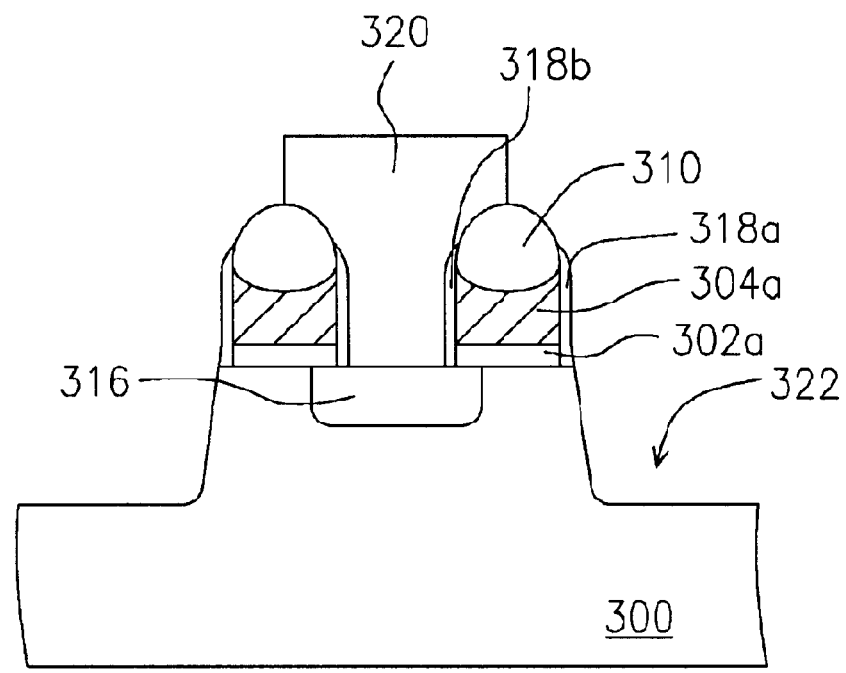

As shown in FIG. 3E, another patterned photoresist layer 320 is formed over the substrate 300. This patterned photoresist layer 320 covers the area over the source region 316. Thereafter, using the patterned photoresist layer 320 and the stack structure 312 with the inter-gate dielectric layer 318a and the inter-gate dielectric layer 318b as a mask, an etching step is conducted to form a trench 322 in the substrate 300 beside one side of the inter-gate dielectric layer 318a.

Figure 3F:
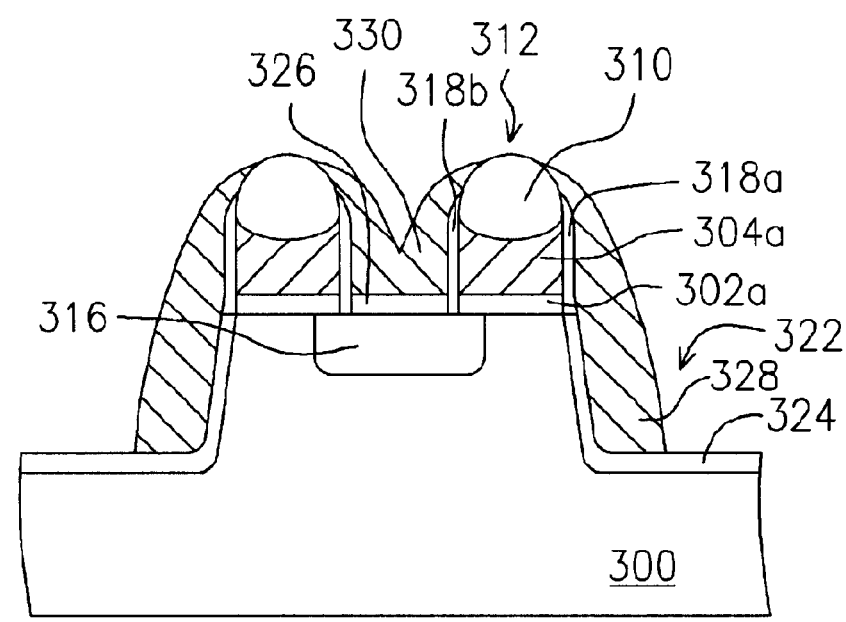

Referring to FIG. 3F, after removing the patterned photoresist layer 320, a dielectric layer 324 is formed at the bottom and on the sidewall of the trench 322. The dielectric layer 324 includes, for example, silicon oxide, and is formed by, for example, thermal oxidation. A dielectric layer 326 is also formed on the source region 316. Further, a thin silicon oxide layer can be formed on the surface of the inter-gate dielectric layers 318a, 318b. The inter-gate dielectric layers 318a, 318b are thus formed with a silicon oxide/silicon nitride/silicon oxide structure.

Thereafter, a conductive layer 328 is formed on the sidewall of the trench 322 and on the sidewall of the stack structure 312 with the inter-gate dielectric layer 318a. This conductive layer 328 serves as the selective gate of the split gate flash memory cell. The conductive layer 328 is formed by, for example, forming a conductive material layer (not show) on the substrate 300, followed by performing an anisotropic etching process to remove a portion of the conductive material layer to form the conductive layer 328 on the sidewall of the trench 322 and on the sidewall of the stack structure 312 with the inter-gate dielectric layer 318a. In this process step, a conductive spacer 330 is also formed on the sidewall of the stack structure 312 where the inter-gate dielectric layer 318b is formed. A material for forming the conductive layer 328 and the conductive spacer 330 includes doped polysilicon. Further, the conductive layer 328 and the conductive spacer 330 are formed by, for example, using chemical vapor deposition to form a doped polysilicon layer, followed by performing an ion implantation step.

Figure 3G:
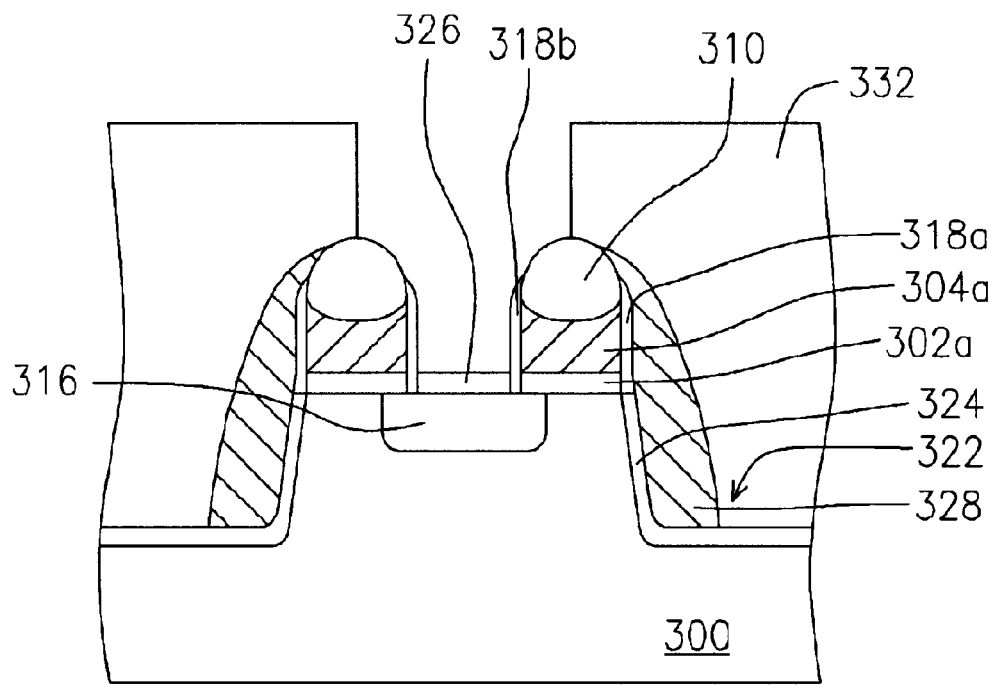

Continuing to FIG. 3G, a patterned photoresist layer 332 is formed over the substrate 300, wherein the patterned photoresist layer 332 exposes the area above the source region 316. An etching step is then performed to remove the conductive spacer 330. A method for removing the conductive spacer 330 includes, for example, wet etching or dry etching. In this exemplary embodiment of the present invention, the conductive spacer 330 of the two neighboring memory cells are electrically connected, mutual interference thus easily occurs between the two neighboring memory cells during operations. Therefore, the conductive spacer 330 needs to be removed. If the conductive spacers 330 of the two neighboring memory cells are not connected, the removal of the conductive spacer 330 is not required.

Figure 3H:
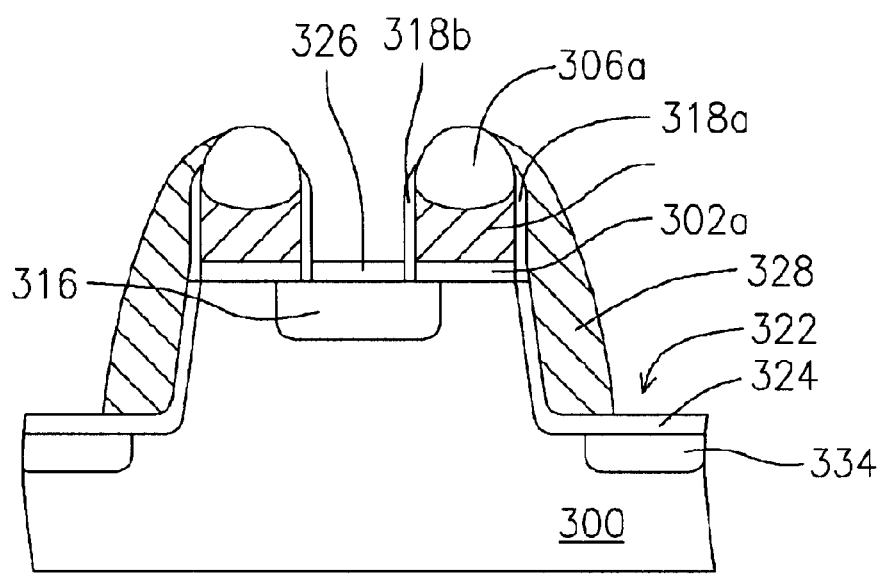

Continuing to FIG. 3H, after the patterned photoresist layer 332 is removed, another patterned photoresist layer (not shown in Figure) is formed on the substrate 300. This patterned photoresist layer exposes the predetermined region for the formation of a drain region. An ion implantation process is then conducted to form the drain region 334 at the bottom of the trench 322 beside one side of the conductive layer 328.

In the above exemplary embodiment, the selective gate (conductive layer 328) is formed on the sidewalls of the stack structure 312 and the trench 322. The channel region of the selective gate (conductive layer 328) is configured along the sidewall of the trench 322 in the substrate 300 (vertical channel). Therefore, even the device dimension (gate length) is reduced, the channel length can be accurately controlled by controlling the depth of the trench 322. The problem of a current flow between the source region and the drain region after a programming operation is thereby prevented.

Further, the selective gate (conductive layer 328) is formed on the sidewalls of the stack structure 312 and the trench 322. The device dimension can be reduced to increase the integration of the device.

Additionally, the selective gate (conductive layer 328) of the present invention is formed by a self-alignment method. Since the application of the photolithography technique is precluded, the process window is increased, while the manufacturing cost and time are reduced.

Moreover, the selective gate (conductive layer 328) of the present invention is formed by a self-alignment method. The two neighboring memory cells are formed with the same channel lengths. Therefore, during the operation of the flash memory device, the problem of asymmetric programming of memory cells can be prevented to increase the reliability of the memory device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A split gate flash memory cell, comprising:
 a substrate, wherein the substrate comprises a trench;
 a stack structure, disposed on the substrate, wherein the stack structure comprises, sequentially from the substrate, a tunneling dielectric layer, a floating gate and a cap layer;
 a first inter-gate dielectric layer, disposed beside a sidewall at a first side of the stack structure, wherein the first inter-gate dielectric layer is contiguous to a top part of the trench;
 a second inter-gate dielectric layer, disposed on the sidewall at a second side of the stack structure;
 a selective gate, disposed on a sidewall of the trench and the sidewall at the first side of the stack structure;
 a selective gate dielectric layer, disposed between the selective gate and the substrate;
 a source region, disposed in the substrate beside the second side of the stack structure; and
 a drain region, disposed at a bottom of the trench beside a side of the selective gate.

2. The memory cell of claim 1, wherein the first inter-gate dielectric layer and the second inter-gate dielectric layer comprise a silicon oxide/silicon nitride material.

3. The memory cell of claim 1, wherein the first inter-gate dielectric layer and the second inter-gate dielectric layer comprise a silicon oxide/silicon nitride/silicon oxide material.

4. The memory cell of claim 1, wherein the tunneling dielectric layer comprises a silicon oxide material.

5. The memory cell of claim 1, wherein the floating gate comprises a doped polysilicon material.

6. The memory cell of claim 1, wherein the selective gate comprises a doped polysilicon material.

* * * * *